United States Patent [19]
Shi et al.

[11] Patent Number: 5,736,754
[45] Date of Patent: Apr. 7, 1998

[54] FULL COLOR ORGANIC LIGHT EMITTING DIODE ARRAY

[75] Inventors: Song Q. Shi, Phoenix; Franky So, Tempe, both of Ariz.

[73] Assignee: Motorola, Inc., Schaumburg, Ill.

[21] Appl. No.: 560,457

[22] Filed: Nov. 17, 1995

[51] Int. Cl.$^6$ .................................................. H01L 33/00
[52] U.S. Cl. .................... 257/89; 257/40; 313/504; 313/509; 340/825.82; 345/83
[58] Field of Search .......................... 313/504, 509, 313/505, 506, 500; 257/88, 89, 40, 103; 340/825.81, 825.82; 345/45, 46, 82, 83, 80, 76

[56] References Cited

U.S. PATENT DOCUMENTS

| | | | |
|---|---|---|---|
| 3,766,447 | 10/1973 | Mason | 257/88 |
| 4,015,166 | 3/1977 | Oshima et al. | 313/503 |
| 4,720,432 | 1/1988 | VanSlyke et al. | 428/457 |
| 5,587,589 | 12/1996 | So et al. | 257/40 |
| 5,663,573 | 9/1997 | Epstein et al. | 257/40 |

FOREIGN PATENT DOCUMENTS 2-244673  9/1990  Japan ........................ 257/40

OTHER PUBLICATIONS

Anonymous, "Electro-Luminescent Backlight for Color Display," IBM Technicl Disclosure Bulletin, vol. 35, No. 2, Jul. 1992, pp. 433–434.

J. Levine, "Multicolor Roled Displays," IBM Technical Disclosure Bulletin, vol. 19, No. 12, May 1977, pp. 4814–4815.

*Primary Examiner*—Jerome Jackson
*Assistant Examiner*—John F. Guay
*Attorney, Agent, or Firm*—Eugene A. Parsons

[57] ABSTRACT

An organic full color light emitting diode array including a plurality of spaced apart, electrically conductive strips formed on a semiconductor substrate, a plurality of cavities defined on top of the strips and three electroluminescent media designed to emit three different hues deposited, along with light transmissive electrical conductors, in the cavities. A transparent dielectric material is formed to seal each of the cavities. The semiconductor substrate is, for example, a CMOS substrate and drivers for the diode array are formed in the substrate.

17 Claims, 2 Drawing Sheets

FULL COLOR ORGANIC LIGHT EMITTING DIODE ARRAY

FIELD OF THE INVENTION

The present invention relates to organic light emitting diode image manifestation apparatus and to a novel method of fabrication of a full color organic light emitting diode (LED) array for image manifestation apparatus.

BACKGROUND OF THE INVENTION

An organic LED array for image display applications is composed of a plurality of organic light emitting pixels arranged in rows and columns. To generate a full color display from a thin film electroluminescent array, there are two primary technologies known in the prior art. A full color array can be achieved by constructing three sub-pixels in one pixel, each sub-pixel emitting red, green or blue. This technology is generally utilized in cathode-ray-tube color displays. An alternative full color array makes use of a white emitter as a backlight in conjunction with a color filter array containing pixels patterned into red, green, and blue sub-pixels. The second technology to generate full color has been widely used in full color liquid crystal displays.

In a full color organic electroluminescent display, the color filter based technology is generally considered less favorable due to the luminescent efficiency limits of most organic LED devices.

In a full color array, each individual organic light emitting pixel is divided into red, green and blue sub-pixels. Each sub-pixel is generally constructed with a light transmissive first electrode, an organic electroluminescent medium deposited on the first electrode, and a metallic electrode on top of the organic electroluminescent medium. The color of the sub-pixel is determined by the electroluminescent medium employed. The electrodes connect the pixels to form a two-dimensional X-Y addressing pattern. In practice, the X-Y addressing pattern is achieved by patterning the light transmissive electrodes in the X direction and patterning the metallic electrodes in the Y direction, with X and Y directions being perpendicular to each other. The patterning of the electrodes is usually accomplished by either shadow mask or etching techniques. Due to the technical limits of shadow masks, only etching processes are being utilized for image displays, which have generally sub-pixel pitches less then 0.2 mm.

Depending on the medium used in etching processes, the etching technique can be divided into two categories: wet and dry. While wet etching is performed in an acidic liquid medium, dry etching is usually carried out in a plasma atmosphere.

Scozzafava in EP 349,265 disclosed an organic electroluminescent image display device and a process for its fabrication based on a wet etching technology. The metallic electrodes used for cathode contacts in organic LEDs usually contain a stable metal and a highly reactive metal (with work function less then 4 eV) that can not survive in the acid etching processes.

The dry etching processes for metallic electrodes in an organic LED array is also problematic. The high temperature (>200° C.) and reactive ion atmosphere required in dry etching process may affect the integrity of the organic materials as well as the active metal contained in the metallic electrodes in an organic LED array.

Tang in U.S. Pat. No. 5,276,380 discloses a shadow wall method to fabricate the two-dimensional array without the need of the etching of the metallic electrodes. The shadow wall method includes: patterning the transparent electrode first; building dielectric walls that are orthogonal to the transparent electrodes, capable of shadowing an adjacent pixel area, and with a height exceeding the thickness of the organic medium; depositing organic electroluminescent medium; and depositing the cathode metals from an angle of 15° to 45° with respect to the deposition surface. Since the height of the dielectric walls exceeds the thickness of the organic medium, isolated parallel metal stripes are formed. Thus, a X-Y addressable array is achieved without the need of metal etching. Though this method seems to be viable for metal patterning, it is limited to certain pitch dimensions, and potentially could introduce leakage in pixels in the array.

A novel method of fabricating a full color diode array on a light transmissive substrate is disclosed in a copending U.S. patent application entitled "Full Color Organic Light Emitting Diode Array", bearing Ser. No. 08/409,129, filed Mar. 22, 1995. However, in some applications it is desirable to fabricate diode arrays on semiconductor substrates so that drivers and the like can be integrated directly with the array. Since the semiconductor substrates generally are not transparent to the emitted light, some important modifications must be made in the array and in the fabrication process.

Thus, it would be advantageous to provide a full color organic LED array which overcomes these problems.

Accordingly, it is a purpose of this invention to provide a novel method of fabrication of a full color organic LED array for image display applications.

It is another purpose of this invention to provide a full color organic LED array fabricated on a semiconductor substrate and novel methods of performing the fabrication.

It is another purpose of this invention to provide a cavity structure in which a full color organic LED array is constructed.

It is a further purpose of this invention to provide a passivated full color organic LED array for image display applications with improved reliability.

SUMMARY OF THE INVENTION

The above problems and others are at least partially solved and the above purposes and others are realized in a full color organic light emitting diode array including a semiconductor substrate having a planar surface. A plurality of laterally spaced, electrically conductive strips are arranged in rows on the surface of the substrate with portions of the surface of the substrate exposed therebetween and a layer of dielectric medium is deposited over the conductive strips and the portions of the surface of the substrate. The dielectric medium is etched to define a plurality of cavity structures, with each cavity structure defining a sub-pixel, and the plurality of cavity structures being positioned in rows in overlying relationship to the plurality of conductive strips with individual cavity structures positioned in overlying relationship to an associated conductive strip so as to expose a portion of the conductive strip. Three electroluminescent media, each including at least a layer of active emitter material and a layer of a light transmissive, electrically conductive material are laterally and alternatively deposited in the cavity structures on the exposed associated conductive strip, with all of the cavity structures in each individual row containing only one kind of the three electroluminescent media. A transparent dielectric material is positioned in sealing engagement over the cavity structures and the electrically conductive material is connected in columns orthogonal to the conductive strips to complete the array.

Methods of fabrication of a full color organic light emitting diode array are also disclosed wherein some of the above steps are repeated to form two or three groups of sub-pixels.

BRIEF DESCRIPTION OF THE DRAWING

Referring to the drawings, wherein like characters indicate like parts throughout the figures.

DESCRIPTION OF THE PREFERRED EMBODIMENTS

Figure 1:
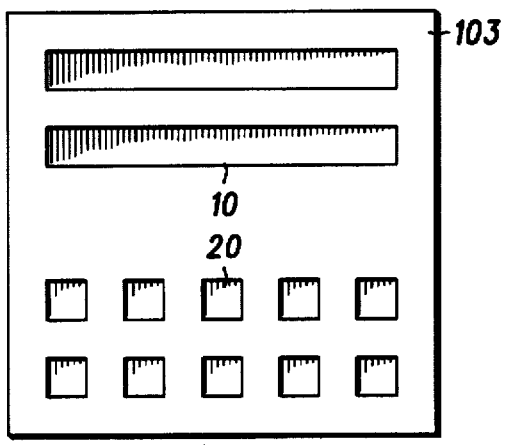
FIG. 1 is a plan view of different cavity structures intentionally depicted on the same substrate to illustrate their dimensional difference.

Since device feature dimensions are often in submicrometer ranges, the drawings are scaled for ease of visualization rather than dimensional accuracy. Referring specifically to FIG. 1, a plan view of trenches 10 and wells 20 are intentionally depicted on the same substrate to illustrate their dimensional difference. Both the trench and the well structures are generally formed by photolithographically patterning a dielectric layer 103 that has been deposited on top of electrically conductive strips 101 (see FIG. 2), of a convenient metal or the like, that are in turn supported by an underlying semiconductor substrate 100, as will be described presently.

Each trench 10 is defined as a long, narrow, straight, deep depression with four relative steep (substantially vertical) sides formed in dielectric layer 103. Each trench 10 typically takes the shape of a rectangular parallelepiped as shown in FIG. 1. A trench 10 generally extends across substrate 100 in a direction either perpendicular to underlying electrically conductive strips 101 (see FIG. 6 for example) or parallel to and on the top of underlying electrically conductive strips 101. In this specific embodiment, trenches 10 are preferably perpendicular to underlying electrically strips 101 so as to form a x-y addressable matrix. A plurality of pixels can be constructed in each single trench 10.

Each well 20 is defined as a hole formed in dielectric layer 103 with a rectangular, square or circular shape of opening, and steep (substantially vertical) side walls. Wells 20 are characterized by the small feature size and nearly isotropic shape of opening. A plurality of wells 20 are constructed in a row across substrate 100 in overlying relationship to electrically conductive strips 101 (see FIG. 6 for example). Each well 20 defines the shape of a sub-pixel in the array. Either trenches 10 or wells 20 can be used in fabrication of a full color organic LED array for image display, as will be described presently. For convenience of further disclosure, both trenches 10 and wells 20 are hereinafter referred to in general as cavity structures, which term also includes other variations on these structures.

The LED array to be described is characterized in that the array is capable of full color image display. Each pixel is composed of three sub-pixels, each having a specific electroluminescent medium capable of emitting light of a different hue, preferably red, or green, or blue. Each sub-pixel is constructed with a cavity structure having electrically conductive strips 101 at the bottom, dielectric medium on the side walls and a transparent dielectric material on the top. A method of fabrication of the full color organic LED array for image display applications, in accordance with the present invention, is disclosed herein. FIGS. 2, 3, 4 and 5 are cross sectional views illustrating a single pixel with three sub-pixels of the LED array at successive stages of fabrication.

Figure 2:
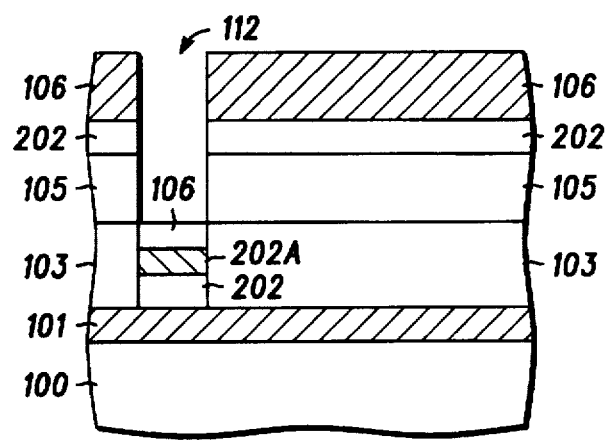
FIGS. 2, 3, 4 and 5 are cross sectional views at successive stages of fabrication of a pixel with three sub-pixels of an organic LED array embodying the present invention.

Referring to FIG. 2, the construction of a pixel begins with a relative flat, semiconductor substrate 100, which may be, for example, a typical CMOS substrate (to be explained in more detail presently). Substrates made of any semiconductor materials can generally be used, but the CMOS substrate is preferred because of the low power driver components which can be incorporated. Generally, the driver circuits and other integrated circuits will be formed before the organic LED array and any high steps or the like which develop on the substrate can be overcome by traditional planarization. A layer of electrically conductive material is deposited on the upper surface of substrate 100, which layer is selected from a variety of stable metals, organic or inorganic conductors, such as aluminum, silver, copper or gold. The layer is then patterned by conventional lithographic techniques to form a plurality of parallel conductive strips 101 that are capable of being addressed in a row fashion (or, conversely, a column fashion if desired) and will serve as an anode or cathode electrode (a cathode in this specific embodiment) in the final array. A layer of dielectric medium 103 is deposited on top of conductive strips 101 and exposed portions of substrate 100, by techniques such as thermal evaporation, sputtering or plasma enhanced chemical vapor deposition. Dielectric medium 103 used in the construction of cavity structures can be an organic polymer or inorganic materials. It is preferred to use an inorganic dielectric material such as silicon dioxide, silicon nitride, or alumina, which is usually a better barrier to oxygen and moisture than organic polymer materials. The thickness of dielectric medium 103 determines the depth of the cavity structures and may vary from 10μm to 0.1μm. For easy processing, a thickness of less then 1 μm is preferred.

A layer 105 of photoresist is spin-coated on top of dielectric medium 103 and patterned with a light source through a mask (not shown). Though both positive and negative resist can be used, it is preferred to use a positive resist for its high resolution and excellent dry etching resistance. After a heat treatment, layer 105 of photoresist is developed to expose underlying dielectric medium 103. Dielectric medium 103 is then patterned by conventional wet or dry etch technique to form a cavity structure or structures 112. Dry etch is generally preferred for its anisotropic character that renders relatively straight or substantially vertical side walls.

At present time, metals with a work function less than 4.0 eV, e.g. lithium, magnesium, indium, calcium etc., are generally used as the cathode material in order to achieve an efficient LED display. It is conceivable in the near future, metals with work function greater than 4.0 eV may also be employed as the cathode material to yield an efficient LED display as the electron injecting and transporting abilities of the materials used in the electroluminescent media improve. As explained in a copending U.S. patent application entitled "Organic LED With Improved Efficiency", Ser. No. 08/304,454, filed on Sep. 12, 1994, and assigned to the same assignee, the best efficiency can be obtained by utilizing an electrically conductive layer including material with a work function which substantially matches an electron affinity of the organic material of the LED. In the present embodiment, a layer of matching work function, conductive material is positioned in cavity 112 as a portion of, or directly on the surface of, conductive strips 101 and similar material is positioned in each of the cavities to be explained. For purposes of this disclosure, the matching work function, conductive material is considered as a portion of conductive strips 101.

An electroluminescent medium 202 is deposited inside cavity structure 112, and in overlying relationship to a single conductive strip of the plurality of conductive strips 101. Electroluminescent medium 202 generally consists of (for purposes of example only) a layer of electron transporting material, a layer of active emitter material capable of emitting the first hue, and a layer of hole transporting material. Since various individual and combinations of layers of electroluminescent material 202 are known, each individual layer is not described in detail herein. A layer 202A of a transparent conductive material, such as conductive polyaniline (PANI), or indium-tin-oxide (ITO) is deposited inside cavity structure 112 as a second electrode (e.g., the anode). Layer 202A can be positioned or deposited in cavity structure 112 by any convenient process, such as evaporation or casting, without damaging electroluminescent material 202. For purposes of this disclosure, layer 202A may be considered a portion of electroluminescent material 202.

The upper end, or opening, of cavity structure 112 is then sealed by deposition of a thick layer 106 of a transparent dielectric material, such as $SiO_2$, silicon nitride deposited by low temperature PECVD, or a transparent perfluoro polymer (e.g. Teflon-AF), as a cap for cavity structure 112. The thickness of layer 106 is controlled so that cavity structure 112 is just filled to the height of dielectric medium 103. A lift-off of photoresist layer 105 is performed to complete the first sub-pixel capable of emitting a first hue, red in this specific embodiment, in the pixel.

Figure 3:
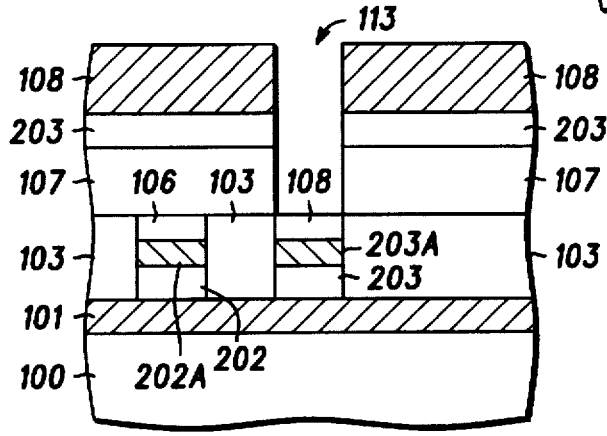

Referring to FIG. 3, the formation of a second sub-pixel is depicted. A layer 107 of photoresist is spin-coated on top of the first sub-pixel and dielectric medium 103 and patterned and developed, generally as described above. The exposed dielectric medium 103 is then patterned to form a second cavity structure or structures 113 adjacent to the first sub-pixel. An electroluminescent medium 203 is deposited in cavity structure 113 and in overlying relationship to the single conductive strip of the plurality of conductive strips 101. As explained in conjunction with electroluminescent medium 202, electroluminescent medium 203 generally consists of a layer of electron transporting material, a layer of active emitter material capable of emitting a second hue, and a layer of hole transporting material. A layer 203A of a transparent conductive material is then deposited as a second electrode (e.g. the cathode). Layer 203A can be positioned or deposited in cavity structure 113 by any convenient process, such as evaporation or casting, without damaging electroluminescent material 203. For purposes of this disclosure, layer 203A may be considered a portion of electroluminescent material 203.

The upper end, or opening, of cavity structure 113 is then sealed by deposition of a thick layer 108 of a transparent dielectric material, such as $SiO_2$, silicon nitride deposited by low temperature PECVD, or a transparent perfluoro polymer (e.g. Teflon-AF), as a cap for cavity structure 113. The thickness of layer 108 is controlled so that cavity structure 113 is just filled to the height of dielectric medium 103. A lift-off of photoresist layer 107 is performed to complete the construction of the second sub-pixel in the pixel, capable of emitting the second hue, in this specific embodiment green, is complete.

Figure 4:
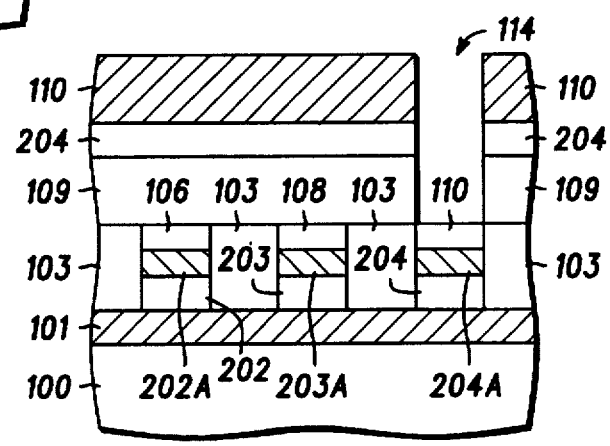

Referring to FIG. 4, the formation of a third sub-pixel is depicted. A layer 109 of photoresist is spin-coated on top of the first and second sub-pixels and dielectric medium 103 and patterned and developed, generally as described above. The exposed dielectric medium 103 is then patterned to form a third cavity structure or structures 114 adjacent to the first and second sub-pixels. An electroluminescent medium 204 is deposited in cavity structure 114 and in overlying relationship to the single conductive strip of the plurality of conductive strips 101. As explained in conjunction with electroluminescent medium 202 and 203, electroluminescent medium 204 generally consists of a layer of electron transporting material, a layer of active emitter material capable of emitting a third hue, and a layer of hole transporting material. A layer 204A of a transparent conductive material is then deposited as a second electrode (e.g. the cathode). Layer 204A can be positioned or deposited in cavity structure 114 by any convenient process, such as evaporation or casting, without damaging electroluminescent material 204. For purposes of this disclosure, layer 204A may be considered a portion of electroluminescent material 204.

The upper end, or opening, of cavity structure 114 is then sealed by deposition of a thick layer 110 of a transparent dielectric material, such as $SiO_2$, silicon nitride deposited by low temperature PECVD, or a transparent perfluoro polymer (e.g. Teflon-AF), as a cap for cavity structure 114. The thickness of layer 110 is controlled so that cavity structure 114 is just filled to the height of dielectric medium 103. A lift-off of photoresist layer 109 is performed to complete the construction of the third sub-pixel in the pixel, capable of emitting the third hue, in this specific embodiment blue, is complete.

Figure 5:
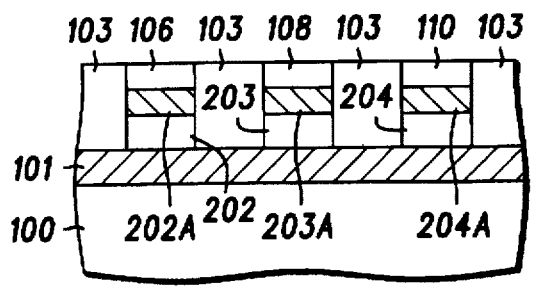

The complete pixel capable of emitting three primary colors is illustrated in FIG. 5. After the lift-off of the last photoresist layer 109, the sub-pixels are then connected, generally by metal strips (not shown) contacting transparent conductive strips 202A, 203A, and 204A adjacent the ends of the columns. The metal strips can be formed by either lithographically patterning a blanket layer of deposited metal or depositing of metal over a resist-masked pattern followed by a lift-off process.

Figure 6:
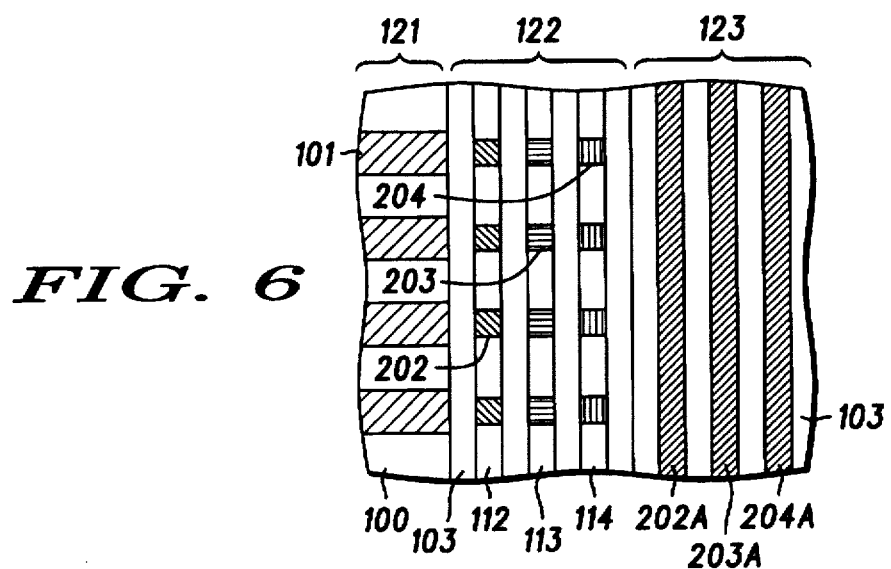
FIG. 6 is a top plan view of the organic LED array with portions broken away for ease of visualization.

FIG. 6 is a plan view of an organic LED array with portions broken away to illustrate three different stages of the fabrication. Proceeding from left to right in FIG. 6, an area 121 illustrates the LED array at a stage where patterned electrically conductive strips 101 have been formed on semiconductor substrate 100. A central area 122 in FIG. 6 illustrates the stage where individual sub-pixels of electroluminescent media 202, 203, and 204 capable of emitting three hues, in this embodiment the primary colors red, green and blue, have been deposited in cavity structures 112, 113 and 114, respectively. Although the sub-pixels are illustrated as individual squares (wells) it will be understood that entire cavity structures could contain electroluminescent material and only the electroluminescent material between electrodes 101 and 202A, 203A, or 204A would be activated.

An area 123 illustrates the array after transparent conductive strips 202A, 203A, and 204A have been deposited in cavity structures 112, 113, and 114. In this embodiment, transparent conductive strips 202A, 203A, and 204A extend the length of cavity structures 112, 113, and 114 to an edge of substrate 100 for conveniently connecting the sub-pixels of all pixels in columns (or rows) as anodic electrodes. It will of course be understood by those skilled in the art that transparent conductive strips 202A, 203A, and 204A can be connected into columns or rows utilizing many other processes, but the process described is generally the most convenient and retains the seal of the various cavity structures.

Figure 7:
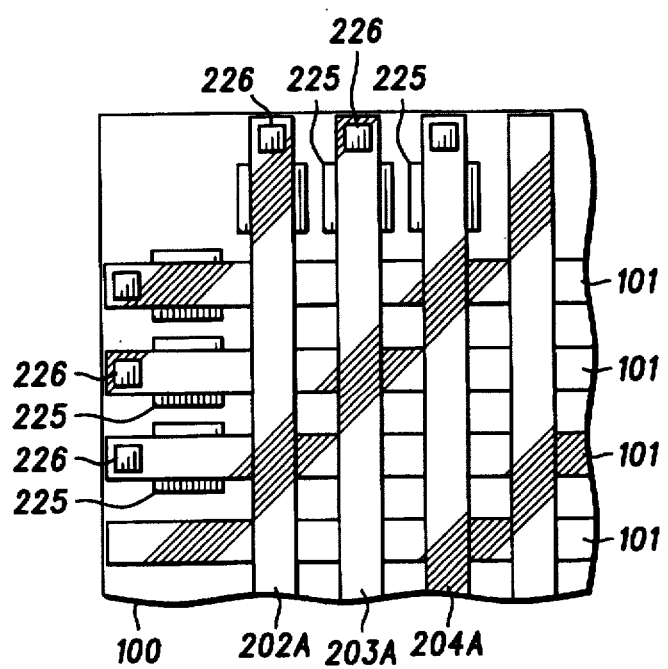
FIG. 7 is a simplified view in top plan, portions thereof broken away, illustrating a portion of an LED array in accordance with the present invention.

Referring specifically to FIG. 7, a simplified view in top plan of a complete LED array in accordance with the present invention is illustrated. Specifically, the ends of conductive strips 101 are illustrated connected to row drivers 225, which are formed in substrate 100 as CMOS drivers. External connection pads 226 are positioned at the edge of substrate 100 for connection to further external circuitry. Similarly, the ends of transparent conductive strips 202A, 203A, and 204A are illustrated connected to column drivers 230, which are formed in substrate 100 as CMOS drivers. External connection pads 231 are positioned at the edge of substrate 100 for connection to further external circuitry. Specific details of drivers 225 and 230 are not illustrated since a large variety of specific driver circuits could be utilized, depending upon the specific type of driving, addressing, etc. utilized.

While the above cavity structures 112, 113 and 114 have been depicted as trenches, it should be understood that an array of well structures can be fabricated in similar fashion, with the exception that the orientation of the trench structures is, preferably, perpendicular to and across all conductive strips 101 in order to form the x-y addressable matrix illustrated in FIG. 7.

The number of pixels and the sub-pixel pitch, that is the width of a cavity structure, in an array, needed for an image display application, are dependent upon the resolution and size of the display required for the specific application. For example, a minimum of 640×480 pixels, each having three sub-pixels and with a sub-pixel pitch less than 0.1 mm, are needed for satisfactory resolution in a 13 inch diagonal color VGA type of display. The pixel pitch is confined only by the limit of lithography technology, which is around 0.5 µm in current manufacturing technology.

The array disclosed in this embodiment has inherently superior stability over any of the arrays disclosed in the prior art. The organic electroluminescent medium in each sub-pixel (well structure) or row of sub-pixels (trench structure) are enclosed in a well or trench by a first electrode at the bottom, a dielectric medium on the side and a transparent dielectric cap on the top. The disclosed cavity structures significantly reduce the ambient (oxygen and moisture) degradation of the display elements.

The materials used as the electroluminescent medium in the array disclosed in this invention can take any of the forms of organic EL devices disclosed in the prior art. The electroluminescent medium generally consists of a layer of electron transporting material, a layer of active emitter, and a layer of hole transporting material. Organic, organometallic, polymeric or any combination of those materials can be used as hole transporting materials, active emitters and electron transporting materials. It will of course be understood that in some special applications either or both of the hole transporting material and the electron transporting material may be eliminated, although this will generally result in poor light emission.

To achieve the three primary color emissions, namely, red, green and blue, three different active emitters that would generate the desired color emissions in a pixel can be utilized. In each active emitter layer, a fluorescent dopant used for enhancement of the emission efficiency for each individual color in a sub-pixel can also be incorporated. Alternatively, a single emitter capable of blue emission is used as host emitters in all three sub-pixels. To achieve the three primary color emissions, three sub-pixels are then doped with three guest dopants of efficient fluorescent dyes capable of red, green and blue emissions, respectively. The guest dopants act as the real emitters while the host emitter serves as an excited energy transporting medium.

The organic electroluminescent media are deposited by vacuum evaporation when sublimable materials are used. They can also be deposited by other techniques such as injection-fill, spin-coating, roll-coating, dip-coating or doctor-blading from a suitable solution when a polymeric material is used. A mixture of the above-mentioned techniques may be needed in cases where a heterostructure array composed of both sublimable materials and polymers is to be built.

In operation a pattern of light emission from the LED array can be seen from the top surface of the LED array. The LED array is driven to emit light by programming electronic drivers 225 and 230, which sequentially addresses one row of sub-pixels at a time and repeats the addressing sequence at such a rate that the interval between repeated addressing of the same row is less than the detection limit of the human eye, typically less than 1/60th of a second. The eye sees an image formed by the light emission from all of the addressed rows, though the device at any moment is emitting from only one row.

Colors for an image are generated by addressing a combination of sub-pixels in each pixel, generally as follows:

(1) address one sub-pixel to emit red light;

(2) address one sub-pixel to emit green light;

(3) address one sub-pixel to emit blue light;

(4) simultaneously address two sub-pixels that emit red and green to generate a perception of yellow;

(5) simultaneously address two sub-pixels that emit red and blue to generate a perception of purple;

(6) simultaneously address two sub-pixels that emit blue and green to generate a perception of blue-green;

(7) simultaneously address all sub-pixels to generate white light; and (8) address none of the sub-pixels to generate a black background.

It should be emphasized that the fabrication methods disclosed in this invention for an organic LED array capable of full color are also applicable to the fabrication of an array for either a monochrome or a multicolor (other than full color) image. With the selection of either monochrome or multicolor electroluminescent media in a pixel, an array for a monochrome or a multicolor image display application can be fabricated by the same methods disclosed in the foregoing.

Thus, a full color organic LED array for image display and its fabrication methods are disclosed. While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A full color organic light emitting diode array comprising:

a semiconductor substrate having a planar surface;

a plurality of laterally spaced, electrically conductive strips arranged in rows on the surface of the substrate with portions of the surface of the substrate exposed therebetween;

a layer of dielectric medium deposited over the conductive strips and the portions of the surface of the substrate;

a plurality of cavity structures defined by the dielectric medium and each cavity structure defining a sub-pixel, the plurality of cavity structures being positioned in rows in overlying relationship to the plurality of conductive strips with individual cavity structures positioned in overlying relationship to an associated conductive strip so as to expose a portion of the conductive strip;

three electroluminescent media, each including at least a layer of active emitter material and a layer of transparent conductive material, laterally and alternatively deposited in the cavity structures on the exposed associated conductive strip, with all cavity structures in each individual row containing only one kind of the three electroluminescent media, the transparent conductive material being connected to form a plurality of laterally spaced, parallel, metallic strips arranged in columns orthogonal to the conductive strips; and a transparent dielectric material positioned in sealing engagement over the cavity structures.

2. A full color organic light emitting diode array as claimed in claim 1 wherein the substrate includes a CMOS semiconductor chip.

3. A full color organic light emitting diode array as claimed in claim 1 wherein the conductive strips include one of highly doped areas in the substrate and metal strips.

4. A full color organic light emitting diode array as claimed in claim 1 wherein the conductive strips form an n-contact for each diode in the array.

5. A full color organic light emitting diode array as claimed in claim 1 wherein the semiconductor substrate includes driver circuits formed therein for driving the array, the driver circuits being coupled to the conductive strips.

6. A full color organic light emitting diode array as claimed in claim 1 wherein the dielectric medium defining the cavity structures includes one of an organic polymer and an inorganic material.

7. A full color organic light emitting diode array as claimed in claim 6 wherein the dielectric medium defining the cavity structures includes an inorganic material including one of silicon dioxide, silicon nitride, and alumina.

8. A full color organic light emitting diode array as claimed in claim 1 wherein the thickness of the dielectric medium is in a range of 10 µm to 0.1 µm.

9. A full color organic light emitting diode array as claimed in claim 8 wherein the thickness of the dielectric medium is less then 1 µm.

10. A full color organic light emitting diode array as claimed in claim 1 wherein the three electroluminescent media further include a layer of hole transporting material and a layer of electron transporting material positioned to sandwich the layer of active emitter material therebetween.

11. A full color organic light emitting diode array as claimed in claim 10 wherein the layers of hole transporting material, active emitter material and electron transporting material include one of organic, organometallic, polymeric and a combination of organic, organometallic, and polymeric material.

12. A full color organic light emitting diode array as claimed in claim 1 wherein the layer of active emitter material in each of the three electroluminescent media is selected to determine the emission hue of each sub-pixel.

13. A full color organic light emitting diode array as claimed in claim 1 wherein the three electroluminescent media are selected to provide, in cooperation, full color emission by including three different active emitter materials that generate three primary colors, each in a different sub-pixel of a pixel.

14. A full color organic light emitting diode array as claimed in claim 1 wherein the active emitter material of the three electroluminescent media include a single blue host emitter material which is doped in each different one of the three electroluminescent media with a different one of three guest dopants of efficient fluorescent dyes selected for three different hue emissions.

15. A full color organic light emitting diode array as claimed in claim 1 wherein the three electroluminescent media are deposited by one of the following methods: sputtering, thermal evaporation, injection-fill, spin-coating, roll-coating, dip-coating and doctor-blading.

16. A full color organic light emitting diode array as claimed in claim 1 wherein the transparent conductive material in each of the three electroluminescent media include one of conductive polyaniline (PANI) and indium-tin-oxide.

17. A full color organic light emitting diode array as claimed in claim 1 wherein the transparent dielectric material includes one of $SiO_2$ and a transparent perfluoro polymer.

* * * * *